United States Patent [19]

Grabbe

[11] 4,419,818

[45] Dec. 13, 1983

[54] METHOD FOR MANUFACTURING SUBSTRATE WITH SELECTIVELY TRIMMABLE RESISTORS BETWEEN SIGNAL LEADS AND GROUND STRUCTURE

[75] Inventor: Dimitry G. Grabbe, Lisbon Falls, Me.

[73] Assignee: AMP Incorporated, Harrisburg, Pa.

[21] Appl. No.: 314,921

[22] Filed: Oct. 26, 1981

[51] Int. Cl.³ .............................................. H05K 3/30
[52] U.S. Cl. ....................................... 29/832; 29/840; 29/841
[58] Field of Search ................. 29/832, 841, 835, 840, 29/620; 357/65, 67, 68, 69, 70, 51; 338/195; 219/121 LH, 121 LJ; 361/400; 427/96, 102

[56] References Cited

U.S. PATENT DOCUMENTS

| | | | |
|---|---|---|---|
| 3,562,592 | 2/1971 | Cooke | 357/65 X |
| 3,714,709 | 2/1973 | Liederbach | 29/841 |
| 3,768,157 | 10/1973 | Buie | 219/121 LJ X |
| 4,298,856 | 11/1981 | Schuchardt | 338/195 |

Primary Examiner—Howard N. Goldberg
Assistant Examiner—Carl J. Arbes
Attorney, Agent, or Firm—F. Brice Faller

[57] ABSTRACT

Technique for terminating signal leads on a substrate for a semiconductor chip to discrete resistors to eliminate impedance discontinuities involves a substrate having signal leads connected to resistive material which is in turn connected to a ground bus. Laser trimming equipment is used to selectively disconnect signal leads from the resistor zone, or to create separate resistor paths for each signal lead to bus, while trimming the resistor to the required transmission line terminating value. The signal leads are connected to the semiconductor chip by elevated leads which pass over the resistive material and the ground bus.

3 Claims, 3 Drawing Figures

METHOD FOR MANUFACTURING SUBSTRATE WITH SELECTIVELY TRIMMABLE RESISTORS BETWEEN SIGNAL LEADS AND GROUND STRUCTURE

FIELD OF THE INVENTION

This invention relates to substrates for semiconductor chips, and specifically to signal leads, ground bus, and resistor structure whereby individual resistors between signal leads and the ground bus are selectively connected and resistance values varied.

THE PRIOR ART

Prior art substrates consist of a signal lead made up of two parts. The first part is a conductor strip which is deposited on the substrate and extends from the outer edge of the substrate to the inner edge where the chip is attached. The second part is a fine wire or lead, referred to as an elevated lead, which is extended in air from the inner edge of the laminated strip to the chip. A resistor to ground, referred to as a terminating load resistor, is generally connected to the signal lead beyond the outer edge of the substrate on the printed circuit board. This arrangement results in an unterminated transmission line with a discontinuity in the impedance at the point where the elevated resistor lead is attached. The remaining connection from this point on is referred to as an unterminated stub.

The trend in modern integrated circuit technology is toward high frequency signal transmissions. Thus, the high frequency signals on the unterminated signal lead will cause signal reflections at the point of the impedance discontinuity described above.

Generally, when a reference plane in a transmission line is interrupted and the resultant gap is less than one-quarter wavelength, the signals on the transmission line are not seriously disturbed. If, however, the gap is greater than one-quarter wavelength, a larger reflection occurs. Industrial standard is to limit a gap to 1/20 of the wavelength; for military 1/50 is specified. Furthermore, at the low pico-second rise times, the equivalent 1/50 wavelengths are of dimensions encountered in chip packaging. Thus, it is necessary to artificially create reference ground planes to reduce such reflections. The signal reflections could result in undesired switching of adjacent digital circuit components; hence, it is desirable to eliminate the discontinuity in the signal lead. The ideal solution is to move the terminating load resistor located on the printed circuit board to the point of injection of the signal onto the semiconductor device.

SUMMARY OF THE INVENTION

The present invention involves a technique which will enable signal leads to be terminated through a unique resistor to ground at the point where the deposited signal lead changes to the elevated lead going to the chip. Thus, the impedance discontinuity of the unterminated stub will be eliminated and subsequently reflected high frequency signals will be greatly diminished. The invented technique consists of two steps. The first step is to terminate all the signal leads to one side of a resistor zone which is terminated to ground on its other side. The next step is to use a laser or some such method beam to dissect the resistor zone into individual resistors, one resistor for each lead. The value of each lead resistor will then be adjusted or trimmed to the required value. This will enable each lead to be terminated to ground through a unique resistor. In the case of completely isolating the signal lead from the resistive material, the material left between the laser cut and the ground bus will be at ground potential and thereby acts as a reference ground plane. This minimizes the distance over which the elevated lead is not referenced to ground, thus reducing the discontinuity and reflectance of high frequency signal.

DETAILED DESCRIPTION OF THE PREFERRED EMBODIMENT

Figure 1:
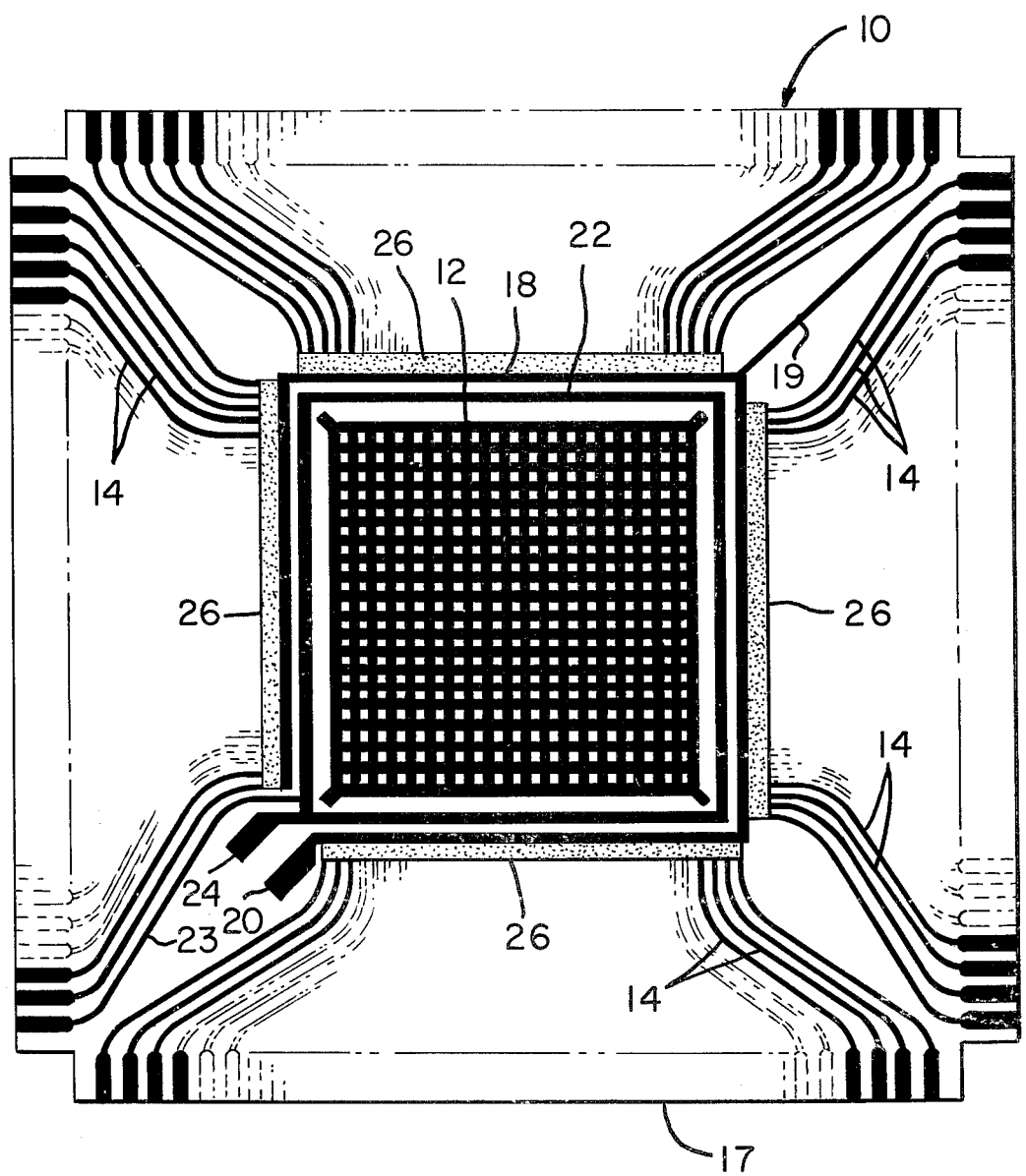
FIG. 1 is a plane view of a substrate having power buses thereon and resistor zones between signal leads and the ground bus.

FIG. 1 shows the substrate 10 of the present invention prior to placement and connection of a semiconductor chip thereon. The substrate is formed of appropriate dielectric material such as beryllium oxide, aluminum oxide, or other suitable dielectric. The circuitry is formed thereon by a standard process such as photoetching, printing, or bonded to the substrate by the procedure described in U.S. Pat. Nos. 3,744,120, 3,766,634, 3,911,553, 3,994,430, and 4,129,243. The chip support pad 12 occupies the center of the substrate 10 and is surrounded completely by the power bus 22 which is connected to one corner of the substrate by the power lead 23. The power bus 22 is surrounded almost completely by the ground bus 18 which is connected to the opposite corner by the ground lead 19. The ground bus 18 is broken where the power lead 23 passes through, at which point the mounting pad 20 on the ground bus 18 lies adjacent the pad 24 on the power bus. The pads 20, 24 serve as mounting means for the attachment of a decoupling capacitor between the power and ground structures. A plurality of signal leads 14 extend between each outer edge 17 of the substrate 10 and the ground bus 18, being separated therefrom by four elongate resistor zones 26 formed on the substrate. Thus, the signal leads 14 are connected to the ground bus 18 through the resistor zones 26.

The deposited resistor zones 26 are formed from material of the thick or thin film type which is frequently a composition of carbon with two metal oxides and a binder. The resistor zones can be screen printed and fixed onto the substrate by conventional thick film techniques as is well known in the hybrid circuit art.

Figure 2:
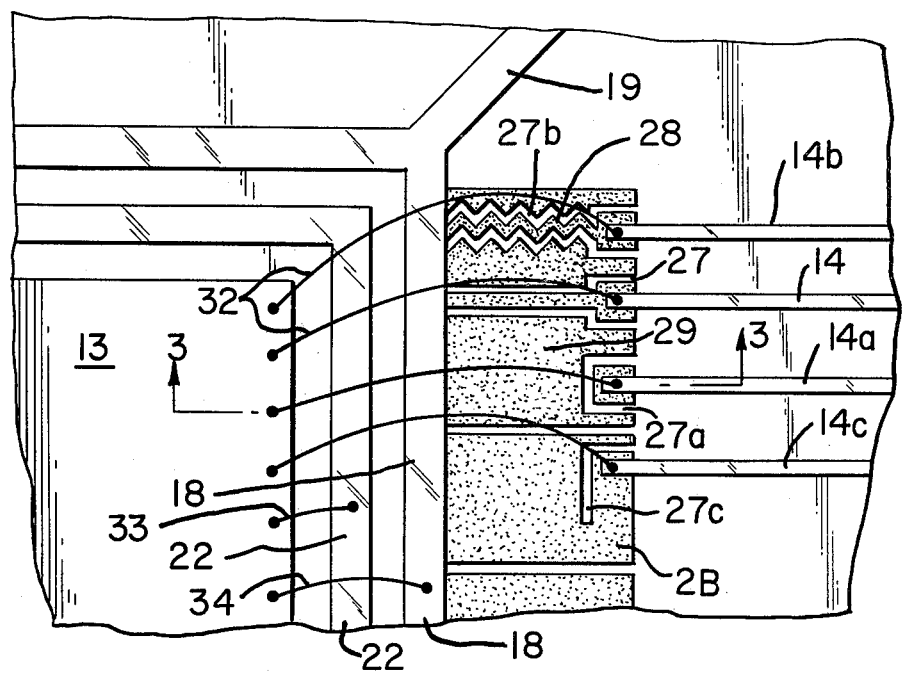
FIG. 2 is an enlarged view of a portion of the substrate between the signal leads and the chip after laser trimming.

FIG. 2 shows the function of the resistor zones 26 with several examples. In general, laser cuts 27 are formed in a resistor zone 26 to isolate discrete portions of the resistor zone between each signal lead 14 and the ground bus 18. A laser cut 27a may completely cut off the signal lead 14a from the ground bus 18, leaving a ground plane 29, as shown in section in FIG. 3. A defined resistor 28 may be extended between the signal lead 14b and the ground bus 18, by using a zig-zag laser cut 27b. Finally, a trimming laser cut 27c may be used to slightly alter the value of the resistance from signal lead 14c to ground 18. Various leads 32, 33, 34 are shown connected to the semiconductor chip 13. Lead 32 connects a signal lead 32 to the chip 13, while lead 33 is a power lead which provides power directly to the chip 13 and lead 34 is a ground lead which provides a direct ground connection from the chip 13. All leads 32, 33, 34 are elevated in the manner of lead 32 as will be explained below.

Figure 3:
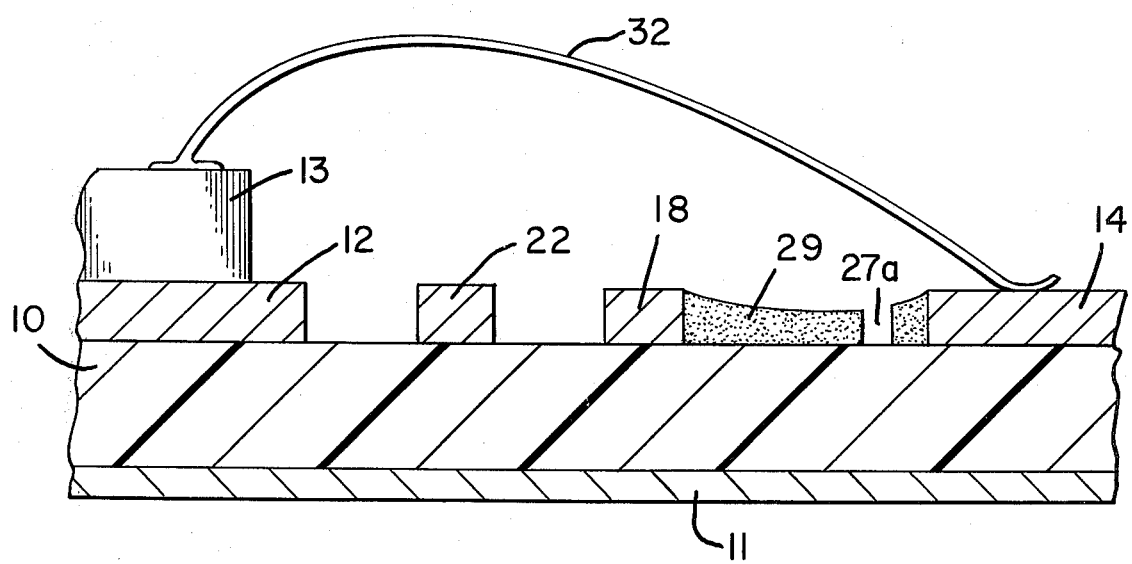
FIG. 3 is a side sectional view of a portion of the substrate between the signal leads and the chip.

FIG. 3 shows an elevated lead 32 which connects each of the signal leads 14 to the semiconductor chip 13 mounted on the chip support pad 12. The elevated wire lead 33 is bonded at both ends and passes over the ground bus 18 and power bus 22. Thus, the elevated wire leads 32 are disposed roughly parallel to the defined resistors 27.

I claim:

1. A method of manufacturing a semiconductor chip carrier comprising the steps of:
   (a) providing a dielectric substrate;
   (b) bonding signal leads and at least one ground bus on said substrate;
   (c) bonding resistive material on said substrate connected between said signal leads and said ground bus;
   (d) selectively removing said resistive material to form discrete paths of desired resistance between at least some of said signal leads and said ground bus,
   (e) placing a semiconductor chip on said substrate adjacent said ground bus; and
   (f) connecting at least some of said signal leads to said semiconductor chip by means of an elevated conductor passing over said resistive material and said ground bus.

2. A method as in claim 1 wherein a power bus is bonded on said substrate between said ground bus and said semiconductor chip, said elevated conductors passing over said resistive material, said ground bus, and said power bus.

3. A method as in claim 1, wherein said ground bus substantially surrounds said chip.

* * * * *